United States Patent [19]

Gurol

[11] Patent Number: 4,604,799
[45] Date of Patent: Aug. 12, 1986

[54] METHOD OF MAKING MOLDED CIRCUIT BOARD

[75] Inventor: Ismail M. Gurol, Seattle, Wash.

[73] Assignee: John Fluke Mfg. Co., Inc., Everett, Wash.

[21] Appl. No.: 414,954

[22] Filed: Sep. 3, 1982

[51] Int. Cl.$^4$ .............................................. H05K 3/02
[52] U.S. Cl. ........................................ 29/897; 29/852; 174/68.5; 264/104; 264/265; 264/272.17; 427/96; 427/97
[58] Field of Search .................... 174/68.5; 204/15; 264/104, 265, 272.17; 427/96, 97; 29/853, 852, 846, 847

[56] References Cited

U.S. PATENT DOCUMENTS

| | | | |
|---|---|---|---|
| 1,767,715 | 6/1980 | Stoekle . | |
| 2,599,710 | 6/1952 | Hathaway . | |
| 2,716,268 | 8/1955 | Steigerwalt | 339/17 B |
| 2,837,619 | 6/1958 | Stein | 201/63 |
| 2,912,747 | 11/1959 | Oshry et al. | 29/853 X |
| 3,883,947 | 5/1975 | Kruger | 29/578 |
| 3,889,363 | 6/1975 | Davis . | |
| 4,017,968 | 4/1977 | Weglin . | |
| 4,088,545 | 5/1978 | Supnet | 204/15 |
| 4,104,111 | 8/1978 | Mack | 174/68.5 |
| 4,152,195 | 5/1979 | Bährle et al. | 427/97 X |
| 4,301,190 | 11/1981 | Feldstein | 427/97 |
| 4,325,780 | 4/1982 | Schulz, Sr. | 174/68.5 X |
| 4,386,116 | 5/1983 | Nair et al. | 204/192 C X |
| 4,424,095 | 1/1984 | Frisch et al. | 174/68.5 X |

FOREIGN PATENT DOCUMENTS

| | | | |
|---|---|---|---|
| 664915 | 6/1963 | Canada | 29/846 |
| 849194 | 8/1970 | Canada . | |
| 885137 | 11/1971 | Canada . | |
| 1075825 | 4/1980 | Canada | 29/846 |
| 0051378 | 5/1982 | European Pat. Off. . | |
| 3017713 | 11/1981 | Fed. Rep. of Germany . | |
| 821841 | 10/1959 | United Kingdom . | |
| 859047 | 1/1961 | United Kingdom . | |
| 937153 | 9/1963 | United Kingdom . | |
| 1404697 | 9/1975 | United Kingdom . | |
| 1455938 | 11/1976 | United Kingdom . | |
| 2033667 | 5/1980 | United Kingdom . | |

Primary Examiner—Howard N. Goldberg
Assistant Examiner—Carl J. Arbes
Attorney, Agent, or Firm—Mikio Ishimaru; Stephen A. Becker; Benjamin J. Hauptman

[57] ABSTRACT

A method of making a molded circuit board includes forming a polymer base with a channel and an intersecting through-hole. The base is conductively coated by means of vacuum deposition to establish a circuit line. After the conductive coating is removed everywhere except the channel and the through-hole, a further conductive material is provided on the coating. The base is subsequently stress relieved and planarized.

68 Claims, 11 Drawing Figures

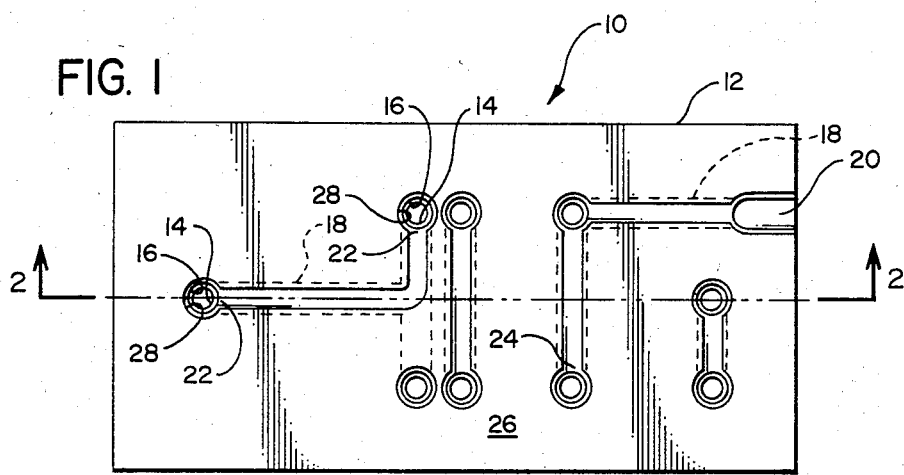
FIG. 1
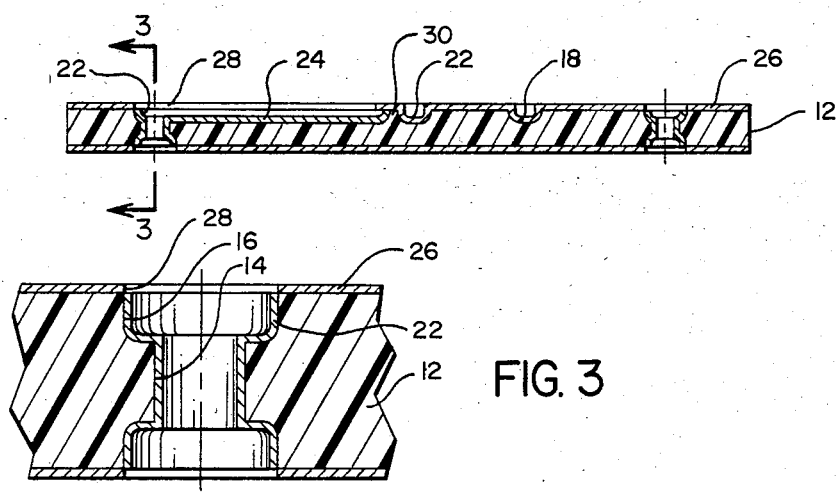
FIG. 2
FIG. 3
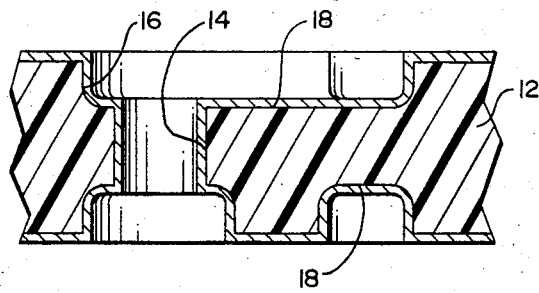
FIG. 4A

METHOD OF MAKING MOLDED CIRCUIT BOARD

FIELD OF THE INVENTION

The present invention relates generally to printed circuit boards and particularly to a nonprinted, channeled circuit board.

BACKGROUND OF THE INVENTION

In the past, when the printed circuit board was first developed, it was hailed as a major advance in electronics technology over hard wired boards in that it permitted more components to be mounted in smaller areas. As the printed circuit board technology evolved, many complex chemical processing techniques developed for improving the number and configuration of circuit lines which could be placed on a circuit board.

Since "printed" circuit board technology involves photographic processes, many different chemical baths are required which means expenses in processing and for the processing equipment. Over 55 different steps are required to make a single printed circuit board. In addition, the need for different chemical steps has resulted in serious problems with chemical waste control both in the vapors and residues of the various processes.

Heretofore, almost all developments in printed circuit board technology have been directed towards improved chemical processes and improved printing techniques. These refinements of technology are rapidly reaching the point of minimal return.

Further, there have been major problems with making connections from the circuit lines on one side of the circuit board to the other and of making adequate connections of components to the boards. This has resulted in a search for a method of making improved conductive connections via the through-holes provided in the board for component mounting.

Originally, the distances between circuit lines were relatively wide and in 1965 the state of the art was approximately 12 mils. By 1980 they were down to 6 mils and current projections are that the maximum theoretical limit using known printed circuit technology is about 2 mils with 0.25 mil thick copper laminations.

Closer line placements are required and this requirement has increased the demand for better insulation between lines as well as better immunity to airborne and chemical processing contaminants. Not only has the progress of printed circuit technology consistantly challenged the plating industry for innovations, but also for economy in the face of rising raw material and energy prices. Further, a greater sense of awareness of environmental protection requirements and for health and safety in the work place have posed tremendous challenges for the industry.

With the new requirements posed and the the new problems, there has been a long felt need for major innovation with respect to processes and equipment in circuit board technology.

SUMMARY OF THE INVENTION

The present invention provides a quantum jump in circuit board technology which is as innovative as the original development of the printed circuit board. The invention further provides a method for manufacturing a circuit board which does not require printing and which, while usable in conjunction with various conventional chemical printing processes, may be manufactured totally without the use of chemicals.

The present invention provides a circuit board in which improved, uniform thickness connections are made from the circuit lines on one side of the board to the other and provisions are made for providing adequate mechanical support and conductive connection for components.

The present invention provides a circuit board with circuit lines which can be closely controlled in thickness by a two step plating process which nonchemically plates a uniform thin layer by a process such as sputtering (which does not cause excessive buildup in corners or edges) followed by chemical plating which allows the thin layer to be accurately thickened.

The present invention provides for a reduction in the number of steps required in manufacturing a circuit board from around 55 to 3; i.e. forming, plating, and surface machining.

The present invention provides a circuit board and manufacturing process which requires a minimal expenditure in raw materials and energy, and further in which all the waste material is recyclable.

The present invention provides a new circuit board and manufacturing process therefore which substantially reduces the cost of circuit boards.

The present invention provides a circuit board and manufacturing process which does not utilize, or utilizes a minimum of, chemicals and thus is not subject to the environmental waste problems attendent upon conventional printed circuit board technology.

The present invention allows for a closer than conventional line spacing by virtue of the circuit lines being recessed into the board material which is a better insulator than the air which the insulator for conventional circuit boards.

The present invention provides for fewer defective boards because the surface machining of the present invention removes a small part of the surface of the board leaving virgin material as the insulator between circuit lines, thus the surface particles and chemical contaminents which provide conductive paths to cause circuit board failures are removed.

The present invention further provides a circuit board and manufacturing process which utilize conventional technology without the need for chemical or photographic techniques.

The above and additional advantages of the present invention will become apparent to those skilled in the art from a reading of the following detailed description when taken in conjunction with the accompanying drawings.

BRIEF DESCRIPTION OF THE DRAWINGS

FIG. 1 is a top view of a circuit board manufactured in accordance with the present invention;

FIG. 2 is a cross-sectional view taken along line 2—2 of FIG. 1;

FIG. 3 is an enlarged, partial cross-sectional view, out of scale, of a through-hole taken along line 3—3 of FIG. 2;

FIG. 4A is an enlarged, partial cross-sectional view, out of scale, of a portion of an embodiment of the present invention during its manufacturing process;

DESCRIPTION OF THE PREFERRED EMBODIMENTS

Figure 4B:
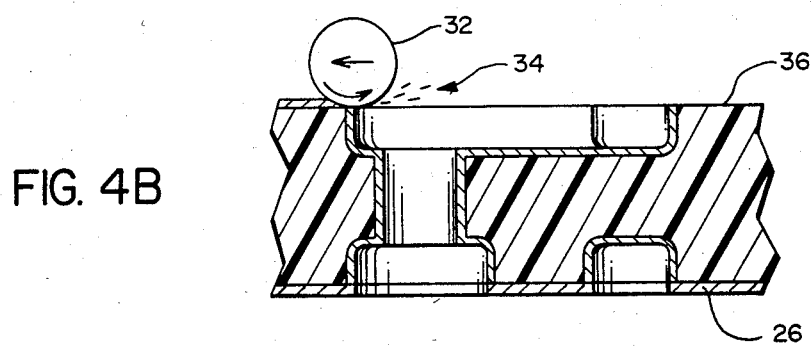
FIG. 4B is an enlarged, partial cross-sectional view, out of scale, of the present invention shown in FIG. 4A during another manufacturing steps.

Referring now to FIGS. 1 and 2, therein are shown a "basic" channeled circuit board 10. The circuit board 10 is made of a formed polymer board or nonconductive base 12 having through-holes 14 surrounded by formed recesses 16 which are connected by formed, depressed, channels 18. The channels 18 are shown with rectangular cross-sections for illustrative purposes; any configuration channel would be satisfactory. The board is generally between 10 to 60 mils thick and the channels 18 between 1 to 10 mils deep. The edge connector depression pad 20 is merely a broadened extension of a channel 18. The through-holes 14, recesses 16, channels 18, and pad 20 are all covered by a conductive material 22, such as copper, to form circuit lines 24. The circuit lines 24 on top and bottom, as best seen in FIG. 2, are connected by the copper 22 in the through-holes 14 and recesses 16.

To protect the circuit board 10 from airborne contaminants which may cause shorting between the circuit lines 24, the nonconductive base 12 is covered by a protective, solder repellent, chemically inert material or solder mask 26 having holes 28 (exaggerated in size in FIG. 1) which encircle the recesses 16 to allow for selective deposition of solder as will later be described. The solder mask 26 completely covers and contacts the nonconductive base 12 and the circuit lines 24 except for the holes 14 and recesses 16.

As may be seen in FIG. 2, the channels 18 are depressed into the nonconductive base 12 such that the two parallel circuit lines 24 are separated by virgin polymer 30. The base 12 may be a thermoplastic such as polysulfone, polyethersulfone, polyetherimide, polyether-ether kefone, etc., of a thermoset material such as dialylphtalate, epoxy, polyester, phenolics, etc.

Since the polymer 30 is selected to be an excellent insulator, much better than air, it is possible to put circuit lines 24 physically closer together than would be possible with conventional printed circuit techniques since these leave the circuit lines above the surface of the base and insulated only by air. Further, the solder mask 6 keeps any contaminants from the polymer 30 and so prevents the future possibility of short circuits.

Referring now to FIG. 3, therein is shown an enlarged, partial cross-sectional view, out of scale, of the through-hole 14 of FIG. 2 taken along line 3—3 which shows the base 10, the conductive material 22 and the solder mask 26.

Figure 5:
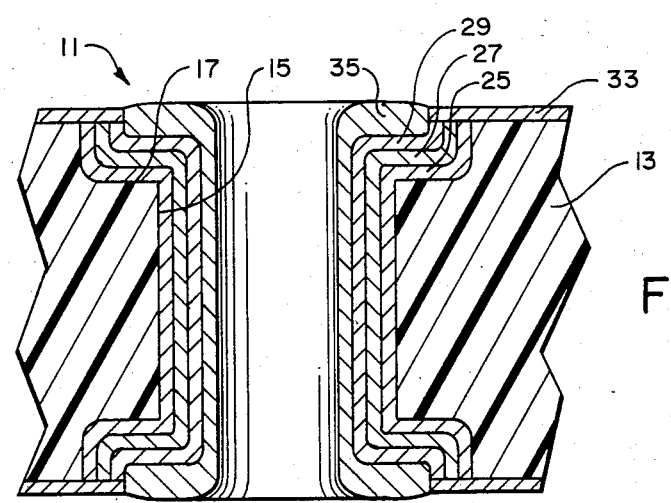
FIG. 5 is an enlarged, partial cross-sectional view, out of scale, of a through-hole similar to FIG. 3 of an alternate embodiment of the present invention.

While the conductive material 22 of the circuit lines 24, the recesses 16 and the through-holes 14 may be of a single conductive material as with the basic channeled circuit board 10, in a "production" channeled circuit board 11 having a nonconductive base 13 with through-holes 15, formed recesses 17, formed channels 18, and pads 20, the conductive material 23 is made up of a number of different materials as shown in FIG. 5 which is a cross-sectional view similar to FIG. 3.

As shown in FIG. 5, the formed polymer board or nonconductive base 13 is covered with a chromium plating 25, generally sputtered, covered by a copper plating 27, generally also sputtered. The chromium plating 25 being a reactive metal acts as an adhesive to bond the copper plating 27 to the base 13. Palladium is an example of another reactive metal which could be used.

In many applications, larger cross-sectional areas of copper, are required than can be quickly applied by sputtering. In those cases, an electrochemical copper plating 29 covers the sputtered copper plating 17.

The conductive material in the circuit lines and the base 13 are covered by a solder repellent mask 33 and a solder such as bright tin plating 35 is then plated on top of the copper plating 29 in recess 17 and the through-hole 15 which are not covered by the solder mask 33.

Referring now to FIGS. 4A and 4B, therein are shown the manufacturing operations for manufacturing a basic channeled circuit board 10. The base 12 is first formed with the channels 18, through-holes 14, and recesses 16 in both surfaces by conventional forming techniques such as injection, compression, or transfer molding, or even stamping. Although the channels 18, through-holes 14 and recesses 16 are provided in the preferred embodiment by being formed when the base 12 is formed, they could also be provided by the expedients such as laser machining or routing and drilling.

While not shown, the base 12 is washed to remove debris from the forming operation and then clamped flat and baked to planarize the boards and stress relieve. The clamping pressure and the baking temperature are dependent upon the exact composition and configuration of the boards and may have to be determined heuristically as would be evident to those skilled in the art.

After planarizing and stress relieving, the base 12 is then coated with the conductive material 22 as shown in FIG. 4A. Generally the coating is copper and the plating application methods are conventional vacuum deposition methods, i.e., ion plating, evaporation deposition, or sputtering. In the preferred embodiment, sputter plating is utilized for depositing copper.

The basic channeled circuit board 10 is then surface machined by any of a number of conventional processes which include sanding, planing, milling, fly cutting, or grinding to remove the sputtered copper 22. As shown in FIG. 4B, when grinding with a grinding wheel 32, particles 34 of copper and polymer will be removed to form a copper-free surface 36 which will be the virgin polymer material of the base 12.

The particles 34 of copper and polymer may be easily recycled by melting out the polymer for new circuit boards and reusing the remaining copper.

After a cleaning operation to remove the debris from the surface machining operation, the solder mask 26 is applied, generally by silk-screening, to the surface 36 of the base 12 as shown in the lower portion of FIG. 4B. The solder mask 26 is applied to the freshly cleaned surface of the board to keep contaminents off the surface 36 and to restrict solder, when it is later plated to the recesses 16, through-holes 14, and pad 20.

The solder mask 26 is not absolutely necessary, if better methods of solder control are available for inserting the components. Similarly, the recesses 16 are provided to provide an improved solder pool for improving the mechanical hold on components and are not absolutely essential to practice the present invention.

Referring now to FIGS. 5A through 5D, therein are shown the multiple manufacturing steps in a production circuit board 11 of the present invention.

As previously described for the basic circuit board 10, the base 13 is formed with channels 18, through-holes 15, and the recesses 17. Generally, the channel 18 will be between 1 to 10 mils deep with a width as small as 2 mils and spaced apart by as little as 2 mils. The base 13 is then cleaned to remove the debris from the forming process and then clamped and baked to planarize and stress relieve the base 13.

Figure 5A:
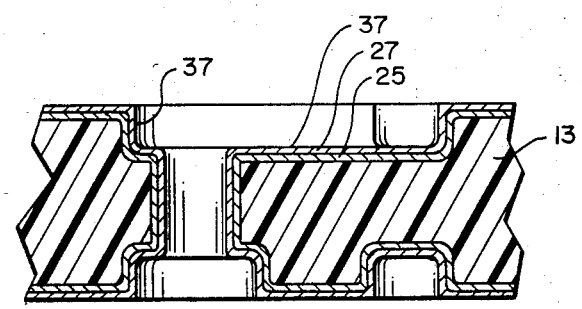
FIG. 5A is a cross-sectional view, out of scale, of the alternate embodiment during its manufacturing process.

As shown in FIG. 5a, the chromium plating 25 is next applied to a thickness of between $2 \times 10^{-4}$ to $15 \times 10^{-4}$ mil by sputtering on top and bottom which also allows a similar thickness in the through-holes 15 and recesses 17. While not absolutely required, the chromium bonds tightly to the base 13 and will also bond tightly to copper plated on it.

After the sputter plating with chromium, the copper plating 27 will be applied by sputtering, generally to a thickness of $5 \times 10^{-3}$ to $30 \times 10^{-3}$ mil thickness.

In the production circuit board 11, while not absolutely required, a layer of sacrificial material such as tin plating 37, may be chemically plated or sputtered onto the sputtered copper plating 27, generally to a thickness of $2 \times 10^{-4}$ to $15 \times 10^{-4}$ mil. This tin plating 37 prevents the copper from oxidizing and being contaminated when the circuit board 11 is removed from the vacuum of the sputtering chamber. As an alternative, the surface of the copper plating 27 could be later chemically etched or deoxidized to the uncontaminated copper.

It should be noted that this sacrificial material is totally removed and does not appear in the finished circuit board.

Figure 5B:
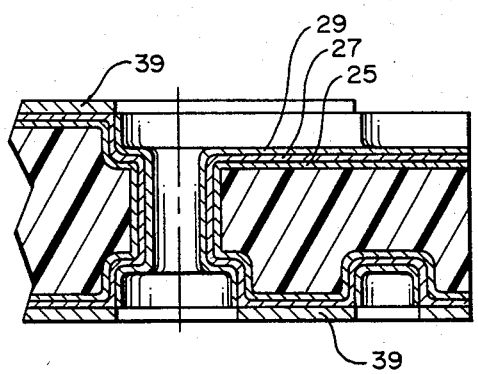
FIG. 5B is an enlarged, partial cross-sectional view, out of scale, of the alternate embodiment shown in FIG. 5A during another step.

The circuit board 11 is next coated with a chemically inactive material or plating resist 39 on all the high surfaces. This plating resist 39, as shown in FIG. 5B, may be applied by roller coating, which would mean that the plating resist 39 is automatically self-aligned to the hole and circuit configuration, or it may be silk-screened.

In the preferred embodiment, the plating resist 39 is a polyethylene plastic which is hot rolled and allowed to cool. This particular material was selected because in its cool state it will act as a dry lubricant for the surface machining process in addition to being immune to the effects of the etch and electrochemical plating solutions. However, many other materials may be used for the plating resist 39. In any event, it is desirable that the plating resist 39 be meltable for recycling.

After the plating resist 39 has been applied, the circuit board 11 is dipped in an etch bath to selectively etch away the sacrificial layer of tin plating 37 where the plating resist 39 has not been applied to leave a clean, sputtered copper plating 27. There are no contaminants between the sputtered tin plating 37 and the sputtered copper plating 29 since both operations are performed sequentially in a vacuum.

While the circuit board 11 is still wet with water from cleaning to remove etch or deoxidant, it will be dipped in copper plating bath, generally electrochemical, to provide the copper plating 29 which may be built up to any desired thickness in the areas not covered by the resist 39. The thickness of copper is between 0.1 to 1.5 mils.

Figure 5C:
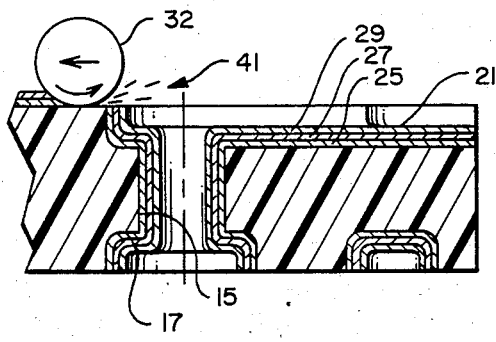
FIG. 5C is an enlarged, partial cross-sectional view, out of scale, of the alternate embodiment shown in FIG. 5A during another of its manufacturing steps.

After chemical copper plating, the circuit board 11 is surface machined, as for example by the grinding wheel 32, and this time, the particles 41 removed are of polymer, chromium, copper, and resist as shown in FIG. 5C. Again, this would be recyclable.

Figure 5D:
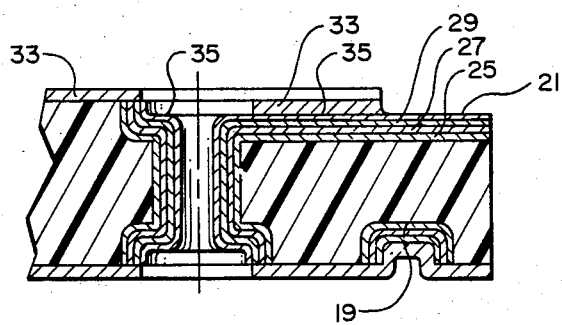
FIG. 5D is a cross-sectional view, out of scale, of the alternate embodiment during another manufacturing step shown in FIG. 5A.

After surface machining and cleaning, the solder mask 33 is applied, by silk-screening or an adhesive film, to form the layers as shown in FIG. 5D. The solder mask 33 provides insulation on top of the circuit lines 31 as well as over the virgin polymer to help completely insulate the conductors in different circuit lines.

After the solder mask 33 is in place, the circuit board 11 may be dipped into a hot tin dip to provide the bright tin plating 35 which is a fusable solder. With the hot dipping operation, hot air leveling will be used to remove the tin plating from those areas on the solder mask 23 where it is not desired. The tin plate thickness would be between 0.5 to 1.5 mils.

As shown in FIG. 5D, the channeled circuit board 11 is complete and ready for insertion of electrical components.

Figure 6:
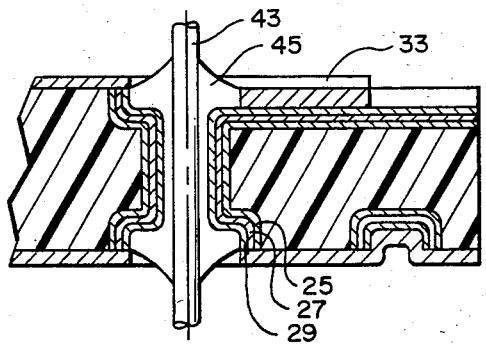
FIG. 6 is a cross-sectional view of a completed alternate embodiment.

Referring now to FIG. 6, therein as shown the channeled circuit board 11 having a component wire 43 held in place by further tin solder 45.

As would be evident to those skilled in the art, if other methods of securing components to a circuit board were developed, such as surface soldering without the need for through-holes, the basic circuit board would only require that the base material have a plurality of conductive material containing channels and the through-holes and recesses would no longer be required.

As would be also evident to those skilled in the art, the present invention is susceptable to multi-layering merely by laminating a number of the boards together using conventional laminating techniques. In addition, it would be possible to make multi-layered boards by the process of coating the boards with additional polymer material and building up additional layers by using conventional printed circuit board technology.

As many possible embodiments and combinations may be made of the present invention without the parting from the scope thereof, it is to be understood that all matters set forth herein are shown in the accompanying drawings to be interpreted in an illustrative and not limiting sense.

I claim:

1. A method of manufacturing a circuit carrier comprising:
   (a) forming a nonconductive polymer base having a channel and an intersecting through-hole provided therein;
   (b) coating said nonconductive base with a conductive material by vacuum deposition to establish a circuit line within said channel including said through hole; and
   (c) removing said conductive material except in said channel and said through-hole,
   wherein said coating is also applied to a nonchannel area of said base, and comprising the further steps of covering a predetermined area of said nonconductive base and said conductive material in said channels with a mask material after removing said conductive material from the nonchannel area and coating said nonconductive base with a further conductive material, said mask material acting as a mask to prevent deposition of said further conductive material onto said predetermined area, including the further step of planarizing and stress relieving said base after forming.

2. The method as claimed in claim 1 including the further step of coating said nonconductive base with a bonding material before coating with said conductive material.

3. The method as claimed in claim 2 including the further step of surface processing said circuit carrier to remove all materials on the nonchannel area of said nonconductive base.

4. The method as claimed in claim 3 including:
   (a) covering the nonchannel area of said conductive material with a resist material; and
   (b) coating said base with additional conductive material to obtain deposition of said additional conductive material on said conductive material within said channel, said resist material preventing deposition of said additional conductive material onto said nonchannel area.

5. The method as claimed in claim 4 including cleaning said conductive material on the nonchannel area prior to coating said base with resist material.

6. The method as claimed in claim 4 including:
   (a) coating said conductive material with a sacrificial conductive material; and
   (b) removing said sacrificial conductive material prior to coating with said additional conductive material, said sacrificial material being applied in a vacuum environment in which said conductive material is applied to the base to prevent oxidation of said conductive material upon removal from said environment.

7. The method as claimed in claim 4 including:
   (a) cleaning said nonconductive base after forming; and
   (b) cleaning said nonconductive base after removing said conductive material.

8. The method of claim 1, wherein said conductive material is applied by vacuum deposition to a polymer surface of said nonconductive polymer base, said polymer surface being completely cured prior to coating thereof with said conductive material.

9. A method of manufacturing a circuit carrier comprising:
   (a) forming a nonconductive polymer base having a channel provided therein;
   (b) coating said nonconductive base by vacuum deposition with a first conductive material;
   (c) covering a nonchannel area of said nonconductive base and said conductive material thereon with an inactive material;
   (d) coating said base with additional conductive material to obtain deposition of said additional conductive material within said channel, said inactive material preventing deposition of said additional conductive material thereon and removing all materials except in said channel, including stress relieving and planarizing said nonconductive base after forming.

10. The method as claimed in claim 9 including coating said nonconductive base with a bonding material before coating with said first conductive material.

11. A method of manufacturing a circuit carrier comprising:
    (a) forming a nonconductive polymer base having a channel provided therein;
    (b) coating said nonconductive base by vacuum deposition with a first conductive material;
    (c) covering a nonchannel area of said nonconductive base and said conductive material thereon with an inactive material;
    (d) coating said base with additional conductive material to obtain deposition of said additional conductive material within said channel, said inactive material preventing deposition of said additional conductive material thereon, including coating said nonconductive base with a bonding material before coating with said first conductive material and further including surface processing by machining said circuit carrier to remove all materials on the nonchannel area of said nonconductive base.

12. The method as claimed in claim 11 including:
    (a) covering a predetermined area of said additional conductive material and said nonconductive base with a resist material; and
    (b) coating the area not coated with said resist material with a further conductive material, said resist material preventing deposition thereon of said further conductive material.

13. The method as claimed in claim 9 including cleaning said first conductive material on the nonchannel area not coated with said inactive material before coating with said additional conductive material.

14. A method of manufacturing a circuit carrier comprising:
    (a) forming a nonconductive polymer base having a channel provided therein;
    (b) coating said nonconductive base by vacuum deposition with a first conductive material;
    (c) covering a nonchannel area of said nonconductive base and said conductive material thereon with an inactive material;
    (d) coating said base with additional conductive material to obtain deposition of said additional conductive material within said channel, said inactive material preventing deposition of said additional conductive material thereon including:
        coating said first conductive material with a sacrificial conductive material; and
        removing said sacrificial conductive material prior to coating with said additional conductive material and removing all materials except in said channel.

15. A method of manufacturing a circuit board comprising:
    (a) forming a nonconductive polymer board having a channel, a channel-intersecting recess, and a recess-intersecting through-hole formed in one surface thereof;
    (b) plating by vacuum deposition said nonconductive board including said channel, said recess, and said through-hole with a first conductive metal; and
    (c) surface processing to remove all of said first conductive metal except in said channel, said recess, and said through-hole, including applying a mask material to a predetermined area of said nonconductive board and said first conductive metal in each channel after surface processing and coating the area to which said mask material has not been applied with a fusible material, said mask material preventing deposition of fusible material thereon and further including stress relieving said nonconductive-board before plating.

16. The method as claimed in claim 15 including planarizing during stress relieving.

17. The method as claimed in claim 16 including plating said nonconductive board with a bonding metal before plating with said first conductive metal.

18. The method as claimed in claim 17 including surface machining said circuit board to remove all materials and metals on the nonchannel area of said nonconductive board.

19. The method as claimed in claim 17 including:
(a) coating the nonchannel surface area of said first conductive metal with a resist material; and
(b) plating the channel surface area not coated with said resist material with additional conductive metal.

20. The method as claimed in claim 19 including chemically cleaning said first conductive metal on the nonchannel area prior to coating said channel area with said resist material.

21. The method as claimed in claim 19 including:
(a) plating said first conductive metal with a sacrificial conductive metal; and
(b) chemically removing said sacrificial conductive metal prior to plating the channel surface area not coated with said resist material with additional conductive metal, said sacrificial material preventing oxidation of said first conductive metal upon removal of said conductive metal from a vacuum environment for application of said resist material.

22. A method of manufacturing a circuit board comprising:
(a) forming a nonconductive polymer board having a channel formed in one surface thereof;
(b) plating said nonconductive board with a first conductive metal by vacuum deposition;
(c) applying a resist material to a predetermined area of said nonconductive base;
(d) chemically coating the area to which said resist material has not been applied with additional conductive material; and
(e) surface processing said board to remove said first conductive metal except in each channel, including stress relieving said nonconductive base before plating.

23. A method of manufacturing a circuit board comprising:
(a) forming a nonconductive polymer board having a channel, a channel-intersecting recess, and a recess-intersecting through-hole formed in one surface thereof;
(b) plating by vacuum deposition said nonconductive board including said channel, said recess, and said through-hole with a first conductive metal; and
(c) surface processing to remove all of said first conductive metal except in said channel, said recess, and said through-hole including:
cleaning said nonconductive board after forming; and
cleaning said nonconductive board after removing said first conductive metal.

24. The method as claimed in claim 23 including planarizing during stress relieving.

25. The method as claimed in claim 24 including plating said nonconductive base with a bonding metal before plating with said first conductive metal.

26. The method as claimed in claim 25 including surface machining said circuit board to remove all materials and metals on the nonchannel area of said nonconductive base.

27. The method as claimed in claim 26 including:
(a) coating a predetermined area of said additional conductive metal and said nonconductive board with a solder repellant material; and
(b) plating the additional conductive metal not coated with said solder repellant material with a further conductive metal.

28. The method as claimed in claim 27 including chemically cleaning said first conductive metal on the non-channel area not coated with said resist material before plating said non-channel areas with additional conductive metal.

29. The method as claimed in claim 27 including:
(a) plating said first conductive metal with a sacrificial conductive metal applied to prevent oxidation of said first conductive metal; and
(b) chemically removing all of said sacrificial conductive metal prior to chemically plating the channel surface area not coated with said resist material with said additional conductive metal.

30. The method as claimed in claim 27 including:
(a) cleaning said nonconductive base after forming; and
(b) cleaning said nonconductive base after removing said first conductive metal.

31. A method of manufacturing a circuit board comprising:
(a) molding a polymer base with a plurality of circuit line channels molded in one surface thereof, said base having a plurality of recesses molded therein intersecting said channels, said base having a plurality of through-holes moulded therein intersecting said recesses;
(b) nonchemically plating all surface areas of said polymer base with copper; and
(c) surface machining said one surface of said circuit board to remove all said copper except in said channel, said recesses, and said through-holes.

32. The method as claimed in claim 31 including:
(a) applying a solder repellent material to a predetermined area of said polymer base after surface machining; and
(b) plating the areas to which said solder repellent material has not been applied with solder.

33. The method as claimed in claim 32 including heat stress relieving said polymer before plating.

34. The method as claimed in claim 33 including planarizing by pressurizing said polymer base between two parallel clamping surfaces during stress relieving.

35. The method as claimed in claim 34 including nonchemically plating said polymer base with a bonding metal before plating with said copper, and including the further steps of
(a) coating the nonchannel surface area of said copper with a dry lubricant resist material;
(b) electrochemically plating the channel surface area not coated with said dry lubricant resist material with additional copper; and
(c) lubricating a machining tool used during said surface machining with said dry lubricant resist material.

36. The method as claimed in claim 35 including:
(a) chemically etching the surface of said copper prior to electrochemically plating said copper in said channels with said additional copper; and (b) fluid washing said circuit board and keeping said fluid from drying on said copper in said channel prior to electrochemical plating with said additional copper.

37. The method as claimed in claim 35 including:
(a) plating said copper with a sacrificial conductive metal to prevent oxidation of said copper;
(b) chemically removing said sacrificial conductive metal with a fluid etch prior to electrochemically plating said copper in said channels with said additional copper; and
(c) fluid washing said circuit board and keeping said fluid from drying on said copper in said channels prior to electrochemical plating of said additional copper.

38. The method as claimed in claim 37 including:
(a) detergent and fluid cleaning of said base after forming; and
(b) detergent and fluid cleaning of said polymer base after plating with said conductive metal.

39. A method of manufacturing a circuit board comprising:
(a) molding a polymer base with a plurality of circuit line channels molded in one surface thereof;
(b) nonchemically plating said polymer base with copper;
(c) coating the nonchannel surface area of said copper with a chemically inactive, dry lubricant material;
(d) electrochemically plating the channel surface area not coated with said chemically inactive, dry lubricant material with additional copper; and
(e) surface machining using said inactive material as a dry lubricant said one surface of said circuit board to remove all said copper except in said channel.

40. The method as claimed in claim 39 including:
(a) applying a solder repellent material to a predetermined area of said polymer base after surface machining; and
(b) plating the areas which said solder repellent material has not been applied with solder.

41. The method as claimed in claim 40 including heat stress relieving said polymer base before plating.

42. The method as claimed in claim 41 including planarizing by pressurizing said polymer base between two parallel surfaces during stress relieving.

43. The method as claimed in claim 42 including nonchemically plating said polymer base with a bonding metal before plating with said copper, and including the further steps of
(a) coating the nonchannel surface area of said copper with a dry lubricant resist material;
(b) electrochemically plating the channel surface area not coated with said dry lubricant resist material with additional copper; and
(c) lubricating a machining tool used for said surface machining with said dry lubricant resist material.

44. The method as claimed in claim 43 including:
(a) chemically etching the surface of said copper prior to electrochemically plating said copper in said channels with said additional copper; and
(b) fluid washing said circuit board and keeping said fluid from drying on said copper in said channel prior to electrochemical plating said additional copper.

45. The method as claimed in claim 44 including:
(a) plating said copper to prevent oxidation thereof with a sacrificial conductive metal;
(b) chemically removing said sacrificial conductive metal with a fluid etch prior to electrochemically plating said copper in said channels with said additional copper; and
(c) fluid washing said circuit board and keeping said fluid from drying on said copper in said channels prior to electrochemical plating of said copper.

46. The method as claimed in claim 45 including:
(a) detergent and fluid cleaning of said base after forming; and
(b) detergent and fluid cleaning of said polymer base after plating said conductive metal.

47. A method of manufacturing a circuit board comprising:
(a) injection molding a thermoplastic base with a plurality of circuit line channels, channel-intersecting recesses, and recess-intersecting through-holes molded in one surface thereof;
(b) sputtering said thermoplastic base with copper; and
(c) surface machining said one surface of said circuit board to remove all of said copper from said thermoplastic base except in said plural channels, recesses, and through-holes.

48. The method as claimed in claim 47 including:
(a) silk-screening a solder mask to said circuit board except on predetermined areas; and
(b) plating solder on said predetermined areas.

49. The method as claimed in claim 48 including stress relieving said thermoplastic base by oven baking before plating.

50. The method as claimed in claim 49 including planarizing by clamping said thermoplastic base between two flat surfaces during stress relieving.

51. The method as claimed in claim 50 including sputtering chromium as a bonding material on said thermoplastic base before sputtering said copper.

52. The method as claimed in claim 51 including dipping said circuit board in deoxidizing fluid prior to electrochemical plating of said additional copper.

53. The method as claimed in claim 52 including:
(a) hot coating the nonchannel surface area of said copper with polyethylene;
(b) electrochemically plating the channel surface area not coated with said polyethylene with additional copper; and
(c) lubricating a machining tool used for said surface machining with said polyethylene.

54. The method as claimed in claim 53 including:
(a) chemically etching the surface of said copper with a fluid etch prior to electrochemically plating said additional copper; and
(b) keeping said fluid etch from drying on said copper prior to electrochemical plating said additional copper.

55. The method as claimed in claim 54 including:
(a) sputtering tin on said copper;
(b) etching away said tin in acid prior to electrochemically plating said additional copper; and
(c) fluid washing and keeping said fluid from drying on said copper prior to electrochemically plating said additional copper.

56. The method as claimed in claim 55 including:
(a) cleaning with detergent and fluid said thermoplastic base after forming; and
(b) detergent and fluid cleaning of said thermoplastic base after removing said copper.

57. A method of manufacturing a circuit board comprising:
 (a) injection molding a thermoplastic base with a channel molded in one surface thereof;
 (b) sputtering said thermoplastic base with copper;
 (c) hot roller coating the nonchannel surface area of said copper with polyethylene;
 (d) electrochemically plating the channel surface area not coated with said polyethylene with additional copper; and
 (e) surface machining, using said polyethylene as a dry lubricant, said one surface of said circuit board to remove all of said copper from the nonchannel surface area.

58. The method as claimed in claim 57 including:
 (a) silk-screening a solder mask to said circuit board except on pedetermined areas; and
 (b) tin plating solder only on said pedetermined areas.

59. The method as claimed in claim 58 including stress relieving said thermoplastic base by oven baking before plating.

60. The method as claimed in claim 59 including planarizing by clamping said thermoplastic base between two flat surfaces during stress relieving.

61. The method as claimed in claim 60 including sputtering chromium on said thermoplastic base before sputtering said copper.

62. The method as claimed in claim 61 including dipping said circuit board in deoxidizing fluid prior to electrochemical plating of said additional copper.

63. The method as claimed in claim 57 including:
 (a) chemically etching the surface of said copper with a fluid etch prior to electrochemically plating said additional copper; and
 (b) keeping said fluid etch from drying on said copper prior to electrochemical plating said additional copper.

64. The method as claimed in claim 57 including:
 (a) sputtering tin on said copper to prevent oxidation;
 (b) etching away said tin in acid prior to electrochemically plating said additional copper; and
 (c) fluid washing and keeping said fluid from drying on said copper prior to electrochemically plating said additional copper.

65. The method as claimed in claim 57 including:
 (a) detergent and fluid cleaning said thermoplastic base after forming; and
 (b) detergent and fluid cleaning of said thermoplastic base after removing said copper.

66. A method of manufacturing a circuit board comprising:
 (a) injection molding a two sided circuit board with circuit pattern channels, channel-intersecting recesses and recess-intersecting through-holes molded therein;
 (b) cleaning said molded circuit board;
 (c) stress relieving said molded circuit board;
 (d) planarizing said molded circuit board;
 (e) sputtering chromium onto said molded circuit board, including said channels, said recesses, and said through-holes from both sides simultaneously;
 (f) sputtering copper onto said molded circuit board, including said channels, said recesses, and said through-holes from both sides simultaneously;
 (g) surface machining said molded circuit board to remove said chromium and copper from both sides to leave said copper and chromium only in said channels, said recesses, and said through-holes;
 (h) cleaning said molded circuit board;
 (i) applying solder masks to both sides of said circuit board;
 (j) dipping said molded circuit board in solder;
 (k) hot air leveling said solder on said molded circuit board; and
 (l) final cleaning said molded circuit board.

67. The method as claimed in claim 66 including:
 (a) roller coating said molded circuit board with a resist material after cleaning said board;
 (b) dipping said molded circuit board in a deoxidizing dip; and
 (c) chemically copperplating said circuit board to obtain further deposition of copper in said channels, said receiver and said through-holes.

68. A method of manufacturing a circuit board comprising:
 (a) injection molding a two sided circuit board with circuit pattern channels, channel-intersecting recesses, and recess-intersecting through-holes molded therein;
 (b) cleaning said molded circuit board;
 (c) stress relieving said molded circuit board by oven baking;
 (d) planarizing said molded circuit board by pressure clamping;
 (e) sputtering chromium onto said molded circuit board from both sides simultaneously;
 (f) sputtering copper onto said molded circuit board from both sides simultaneously;
 (g) sputtering sacrificial tin onto said copper on said molded circuit board from both sides simultaneously
 (h) hot roller coating only nonchannel areas of said molded circuit board with polyethylene;
 (i) dipping said molded circuit board in an acid bath to etch said sacrificial tin away;
 (j) chemically copper plating said circuit board;
 (k) dry surface machining said molded circuit board to remove only from nonchannel areas said chromium, copper, tin, and polyethylene from both sides;
 (l) cleaning said molded circuit board;
 (m) applying a solder mask to said circuit board;
 (n) dipping said molded circuit board in solder;
 (o) air leveling said solder on said molded circuit board;
 (p) final cleaning said molded circuit board.

* * * * *